(12) United States Patent
Ioakeimidi et al.

(10) Patent No.: US 10,804,069 B2
(45) Date of Patent: Oct. 13, 2020

(54) PHOTOCATHODE DESIGNS AND METHODS OF GENERATING AN ELECTRON BEAM USING A PHOTOCATHODE

(71) Applicant: KLA-TENCOR CORPORATION, Milpitas, CA (US)

(72) Inventors: Katerina Ioakeimidi, San Francisco, CA (US); Gildardo R. Delgado, Livermore, CA (US); Michael E. Romero, San Jose, CA (US); Frances Hill, Sunnyvale, CA (US); Rudy F. Garcia, Union City, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/704,061

(22) Filed: Dec. 5, 2019

(65) Prior Publication Data

US 2020/0111637 A1    Apr. 9, 2020

Related U.S. Application Data

(63) Continuation of application No. 16/150,399, filed on Oct. 3, 2018, now Pat. No. 10,535,493.

(Continued)

(51) Int. Cl.
*H01J 37/073*    (2006.01)
*H01J 37/26*    (2006.01)
(Continued)

(52) U.S. Cl.
CPC ........ *H01J 37/073* (2013.01); *G02B 27/0927* (2013.01); *H01J 1/3044* (2013.01); *H01J 19/24* (2013.01); *H01J 37/06* (2013.01); *H01J 37/26* (2013.01); *H01J 37/28* (2013.01); *H01J 40/06* (2013.01); *H01J 40/18* (2013.01); *H01J 1/34* (2013.01); *H01J 2201/308* (2013.01); (Continued)

(58) Field of Classification Search
CPC ........ H01J 37/073; H01J 40/06; H01J 1/3044; H01J 19/24; H01J 37/06; H01J 37/28; H01J 2237/06333; H01J 1/34; H01J 2201/308; H01J 2201/3423; H01J 2201/3425; H01J 2201/3048; H01J 2201/3426; H01J 2201/30449
See application file for complete search history.

(56) References Cited

U.S. PATENT DOCUMENTS 5,363,021 A ‡ 11/1994 MacDonald ............ H01J 3/022
250/39
5,670,798 A ‡ 9/1997 Schetzina ............. H01L 29/205
257/101

(Continued)

OTHER PUBLICATIONS

ISA/KR, International Search Report and Written Opinion for PCT/US2018/055289 dated Jan. 31, 2019.‡

*Primary Examiner* — Donald L Raleigh
(74) *Attorney, Agent, or Firm* — Hodgson Russ LLP

(57) ABSTRACT

A photocathode can include a body fabricated of a wide bandgap semiconductor material, a metal layer, and an alkali halide photocathode emitter. The body may have a thickness of less than 100 nm and the alkali halide photocathode may have a thickness less than 10 nm. The photocathode can be illuminated with a dual wavelength scheme.

20 Claims, 6 Drawing Sheets

Related U.S. Application Data

(60) Provisional application No. 62/570,438, filed on Oct. 10, 2017.

(51) Int. Cl.
    *G02B 27/09* (2006.01)
    *H01J 40/06* (2006.01)
    *H01J 40/18* (2006.01)
    *H01J 1/304* (2006.01)
    *H01J 19/24* (2006.01)
    *H01J 37/06* (2006.01)
    *H01J 37/28* (2006.01)
    *H01J 1/34* (2006.01)
    *H01L 21/67* (2006.01)

(52) U.S. Cl.
    CPC ............... *H01J 2201/3048* (2013.01); *H01J 2201/30411* (2013.01); *H01J 2201/30449* (2013.01); *H01J 2201/3423* (2013.01); *H01J 2201/3425* (2013.01); *H01J 2201/3426* (2013.01); *H01J 2237/06333* (2013.01); *H01J 2237/24521* (2013.01); *H01J 2237/24592* (2013.01); *H01J 2237/2817* (2013.01); *H01L 21/67288* (2013.01)

(56) References Cited

U.S. PATENT DOCUMENTS

| | | | |
|---|---|---|---|
| 2006/0055321 A1* | 3/2006 | Maldonado | H01J 9/12 313/527 |
| 2008/0116368 A1‡ | 5/2008 | Uchiyama | H01J 37/244 250/28 |
| 2013/0011656 A1‡ | 1/2013 | Zhang | C30B 29/406 428/312.8 |
| 2013/0248815 A1* | 9/2013 | Fuke | H01J 9/12 257/11 |
| 2014/0034816 A1‡ | 2/2014 | Chaung | H01J 1/34 250/21 |
| 2014/0265828 A1* | 9/2014 | Maldonado | H01J 40/14 315/11.5 |
| 2014/0332374 A1‡ | 11/2014 | Deutsch | H01L 21/283 204/242 |
| 2016/0281247 A1‡ | 9/2016 | Friedman | C25B 9/08 |
| 2017/0141256 A1‡ | 5/2017 | Kayes | H01L 31/184 |

\* cited by examiner
‡ imported from a related application

| Method | λ1 (nm) | λ2 (nm) | λ3 (nm) | Comments |
|---|---|---|---|---|
| Activate with λ1, pump with λ2 | 350-257 | 350-213 | | λ2(eV)>6.3eV-λ1(eV) |
| Activate with λ1, pump with λ1 and λ2 | 350-257 | 350-213 | | λ2(eV)>6.3eV-λ1(eV) Keeps activation and prevents defects from recombining |
| Pump with λ1 and λ3 (EIT - EM induced transparency) | 350-257 | | <213 | Keeps defects from consuming photoemissive wavelengths |

FIG. 4

PHOTOCATHODE DESIGNS AND METHODS OF GENERATING AN ELECTRON BEAM USING A PHOTOCATHODE

CROSS-REFERENCE TO RELATED APPLICATIONS

This application is a continuation of U.S. application Ser. No. 16/150,399 filed on Oct. 3, 2019, which claims priority to the provisional patent application filed Oct. 10, 2017 and assigned U.S. App. No. 62/570,438, the disclosures of which are hereby incorporated by reference.

FIELD OF THE DISCLOSURE

This disclosure relates to photocathodes.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Electron beams are used in a number of different applications during semiconductor manufacturing. For example, electron beams can be modulated and directed onto an electron-sensitive resist on a semiconductor wafer, mask, or other workpiece to generate an electron pattern on the workpiece. Electron beams also can be used to inspect a wafer by, for example, detecting electrons emerging or reflected from the wafer to detect defects, anomalies, or undesirable objects.

These inspection processes are used at various steps during a semiconductor manufacturing process to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Photocathodes have been used to generate electron beams. A single light beam incident on a photocathode system can generate a single electron beam with high brightness that is capable of delivering high electron current density. Single wavelengths used to generate an electron beam were not tailored to the energy bands of the photocathode material. Thus, the quantum efficiency (QE), emittance, energy spread, and heat dissipation are not optimized.

Alkali halide photocathodes such as CsI and CsBr have demonstrated photoemission from intraband states when illuminated with wavelengths much longer than their bandgap energy. So far, the illumination schemes to pump these photocathodes involve either short wavelengths with energies larger than the bandgap or longer wavelengths that first activate the color centers located at about 4.7 eV above the valence band. These schemes have been tried both in transmission and in reflection mode. For reflection mode, 257 nm and 266 nm beams have successfully activated the color centers and photogenerated electrons in vacuum. A 410 nm beam was not successful at activating defects and simultaneously transferring the electrons to vacuum.

Increased quantum efficiency has been demonstrated when alkali halide materials are in contact with an $In_xGa_{(1-x)}N$ p-doped layer. The enhanced quantum efficiency of this structure is because the intraband states level aligns with the InGaN valence band (VB), which provides a pathway of the photogenerated electrons to vacuum.

However, previous material combinations were not designed specifically to overcome the tradeoff between quantum efficiency and emittance that limits the source brightness. Furthermore, dual wavelength excitation schemes or dual transmission/reflection excitation schemes were not used for brightness optimization of the different layers.

Therefore, improved photocathode designs and methods of operation are needed.

BRIEF SUMMARY OF THE DISCLOSURE

A photocathode is provided in a first embodiment. The photocathode includes a body fabricated of a wide bandgap semiconductor material, a metal layer disposed on the first surface, and an alkali halide photocathode emitter disposed on the second surface. The body has a first surface and a second surface opposite the first surface. The body has a thickness between the first surface and the second surface of less than 100 nm. The alkali halide photocathode has a thickness less than 10 nm.

The metal layer can include one or more of ruthenium, iridium, platinum, or gold. For example, the metal layer can include an alloy of ruthenium and platinum.

The wide bandgap semiconductor material can include an alloy of InGaN. For example, the alloy of InGaN may be an alloy of InGaN and GaN.

The wide bandgap semiconductor material can include an alloy of AlGaN. For example, the alloy of AlGaN may be an alloy of AlGaN and GaN.

The wide bandgap semiconductor material can include an alloy of InGaP. For example, the alloy of InGaP may be an alloy of InGaP and GaP.

The wide bandgap semiconductor material can include at least one of GaN and GaP.

The alkali halide photocathode can include one or more of CsI, CsBr, or CsTe.

The photocathode can include a cap layer disposed on the alkali halide photocathode opposite the body. The cap layer may include one or more of ruthenium, boron, or platinum. For example, the cap layer can include an alloy of ruthenium and platinum.

An electron beam tool can include the photocathode of the first embodiment. The electron beam tool can include a detector that receives electrons generated by the electron emitter and reflected from a surface of a wafer.

A method is provided in a second embodiment. A photocathode is illuminated with a photon beam having a dual wavelength scheme. The photocathode includes an alkali halide photocathode disposed on a body. An electron beam is generated as the photocathode is illuminated with the photon beam.

The body may be fabricated of a wide bandgap semiconductor material. The body can have a first surface and a second surface opposite the first surface. The body can have a thickness between the first surface and the second surface of less than 100 nm. The alkali halide photocathode emitter may be disposed on the second surface. The alkali halide photocathode can have a thickness less than 10 nm. The photocathode can further includes a metal layer disposed on the first surface.

Both wavelengths in the dual wavelength scheme may be configured to pump.

The dual wavelength scheme can include a simultaneous mode with transmission and reflection.

The dual wavelength scheme can include a transmission mode or a reflection mode.

DESCRIPTION OF THE DRAWINGS

For a fuller understanding of the nature and objects of the disclosure, reference should be made to the following detailed description taken in conjunction with the accompanying drawings, in which:

FIG. 4 is a table of pumping schemes;

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments of a photocathode that includes a metallic contact (electrical contact), wide bandgap semiconductor (WBS), alkali halide (AH), and an optional cap layer are disclosed. Embodiments of this multilayer structure can affect the alignment of the intraband states with the valence band of the wide bandgap semiconductor to maximize the pathway opportunities for the photogenerated electrons to escape to vacuum while protecting the wide bandgap semiconductor surface. Embodiments disclosed herein provide emittance improvement over negative electron affinity (NEA) wide bandgap photocathodes.

Figure 1:
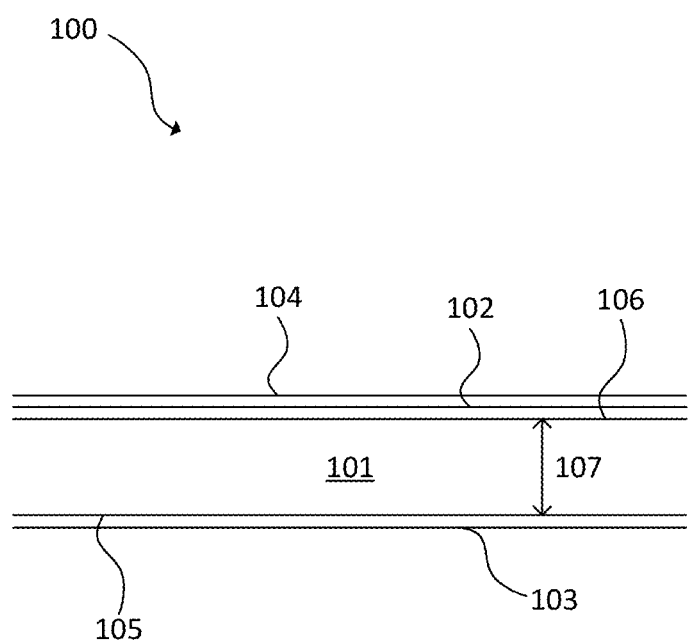
FIG. 1 is a cross-sectional diagram of an embodiment of a photocathode in accordance with the present disclosure.

FIG. 1 is a cross-sectional diagram of an embodiment of a photocathode 100. The photocathode 100, which may be planar, includes a body 101 with a first surface 105 and an opposite second surface 106. In an instance, the body has a thickness 107 between the first surface 105 and second surface 106 of less than 100 nm. A thickness 107 of 100 nm or more may provide inferior performance.

The body 101 can be made of a wide bandgap semiconductor material. In an embodiment, the wide bandgap semiconductor material includes an alloy of InGaN, such as an alloy of InGaN and GaN. In another embodiment, the wide bandgap semiconductor material includes an alloy of AlGaN, such as an alloy of AlGaN and GaN. In yet another embodiment, the wide bandgap semiconductor material includes an alloy of InGaP, such as an alloy of InGaP and GaP. In yet another embodiment, the wide bandgap semiconductor material includes at least one of GaN and GaP. Alloys of InGaN and GaN, AlGaN and GaN, and InGaP and GaP may be multi-quantum well structures. Such multi-quantum well structures can alternate layers of two materials deposited using molecular beam epitaxy or other techniques. Use of the wide bandgap semiconductor material can provide greater stability. For example, initial testing with GaN and AlGaN has provided improved results compared to previous designs.

The body 101 can include various p-doping or n-doping profiles or levels. The doping levels may be from $10^{18}$ to $10^{20}$ cm$^{-3}$.

The material or materials of the body 101 can optimize the alignment of the alkali halide intraband energy states with the alloy's valence band.

A metal layer 103 is disposed on the first surface 105, and can serve as an electrical contact. Thus, the metal layer 103 can enable application of an electric field to guide the electrons toward a surface of the photocathode 100. The metal layer 103 can include one or more of ruthenium, iridium, platinum, or gold. For example, the metal layer 103 can include an alloy of ruthenium and platinum. The metal layer 103 can have uniformity, continuity, and roughness configured to provide improved performance.

An alkali halide photocathode emitter 102 is disposed on the second surface 106. The alkali halide photocathode emitter 102 can have a non-zero thickness less than 20 nm, such as a non-zero thickness of less than 10 nm. This thickness of the alkali halide photocathode emitter 102 is between the second surface 106 of the body 101 and the cap layer 104 in FIG. 1. In an instance, the thickness of the alkali halide photocathode emitter 102 is from 1 nm to 7 nm, including all values to the 0.1 nm and ranges in between. Thicknesses greater than 20 nm may inhibit electron escape. The alkali halide photocathode 102 can include one or more of CsI, CsBr, or CsTe.

A cap layer 104 may optionally be disposed on the alkali halide photocathode 102 opposite the body 101. The cap layer 104 can include one or more of ruthenium, boron, or platinum. For example, the cap layer 104 can include an alloy of ruthenium and platinum. The cap layer 104 can have uniformity, continuity, and roughness configured to provide improved performance.

The cap layer 104 can provide protection to the photocathode 100 and can enable photocathode 100 operation in higher vacuum conditions. The cap layer 104 may reduce oxidation or carbon contamination of the photocathode 100. The cap layer 104 also may enable plasma cleaning of the photocathode 100.

Ruthenium may have the ability to break apart gas molecules that land on its surface or prevent adherence of such gas molecules to its surface. These molecules are capable of distorting the extraction field on the surface of the photocathode 100 and causing enhanced emission which translates as noise in the electron beam because of the mobility and residence time of the molecule on the surface. Thus, a cap layer 104 with ruthenium can be self-cleaning.

Thickness of the layers in the photocathode 100 can be configured to optimize electron emission or to provide maximum quantum efficiency. The exact thickness of the layers may depend on the photocathode 100 extractor configuration and wavelength used for photo electron emission.

Figure 2:
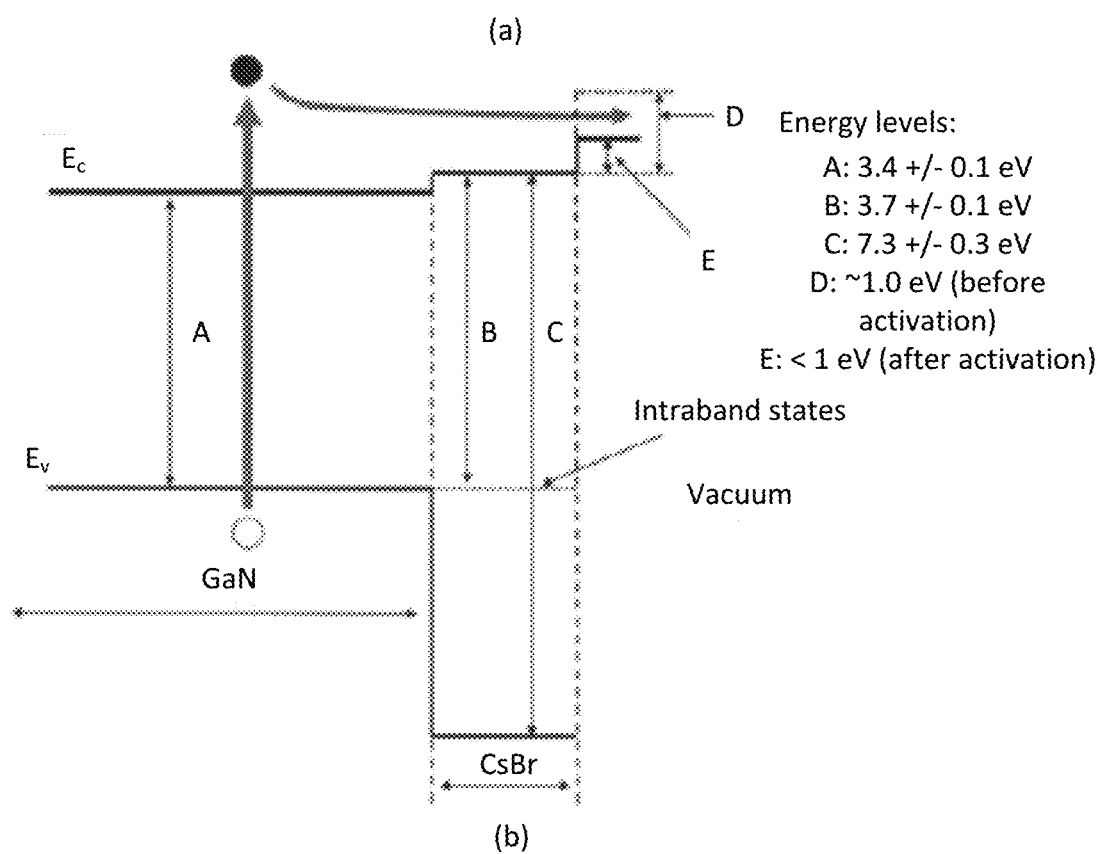
FIG. 2 a photoemission model for an embodiment of the photocathode of FIG. 1.

FIG. 2 a photoemission model for an embodiment of the photocathode 100 using GaN and CsBr. Similar photoemission models exist for other materials that can be used in the photocathode 100. As seen in FIG. 2, the multilayer structure affects alignment of the intraband states with the valence band of the wide bandgap semiconductor in the body 101 to maximize pathway opportunities for the photogenerated electrons to escape to vacuum while protecting the surface of the body 101.

A wide bandgap semiconductor that has a high photo yield such as GaN may not require negative electron affinity conditions and can operate at lower vacuum conditions and have longer lifetime.

Quantum efficiency of the alkali halide photocathodes based on intraband states can be improved due to the photogenerated electrons in the wide bandgap semiconductor region even when illuminated with wavelengths longer than the bandgap energy. The high quantum efficiency of the disclosed photocathode tailors the emittance characteristics of the source to the energy and angular spread of the alkali halide photocathodes, which can provide a high brightness source.

Single or dual wavelength pumping schemes in transmission, reflection, or transmission and reflection simultaneous mode can be used to optimize brightness. The transmission and reflection light can be different wavelengths. The mode of operation (transmission, reflection, or both), and wavelengths used can be used to determine optical thickness of the metal layer 103, the body 101, the alkali halide photocathode emitter 102, and/or the cap layer 104.

In an instance, using optimized wide bandgap semiconductor alloys in combination with an alkali halide layer can provide high brightness photocathode structures pumped with dual wavelength schemes and/or in concurrent reflection and transmission pumping modes.

The brightness of the photocathode emitters may depend on the photocathode material and the excitation wavelength with a general tradeoff between quantum efficiency and emittance.

Embodiments of the photocathode 100 can be used as the electron source in reticle and wafer inspection systems. For example, embodiments of the photocathode 100 can be used as the electron source in electron beam wafer or reticle inspection systems using single or multiple electron sources, electron beam wafer or reticle review systems using single or multiple electron sources, or electron beam wafer or reticle metrology systems using single or multiple electron sources. Embodiments of the photocathode 100 also can be used in systems that require electron sources for generation of x-rays using single or multiple electron sources for use of wafer or reticle metrology, review, or inspection.

Multiple wavelengths can be applied to the photocathode structure 101 that includes an alkali halide, such as CsBr, CsI, or CsTe. The multiple wavelengths can be applied in both reflection and transmission mode to activate and pump intraband states (e.g., color centers) of the alkali halide. The multiple wavelengths can activate the centers, transfer electrons to vacuum, and overcome defects.

Use of multiple wavelengths can increase quantum efficiency and/or achieve the same quantum efficiency as with a single wavelength while producing less heat. Less complex lasers systems can be used to generate multiple wavelengths than a single wavelength. For example, a longer wavelength can use a less complex laser system or optics. Less energy spread of the photogenerated electrons and lower emittance can be achieved.

Figure 3:
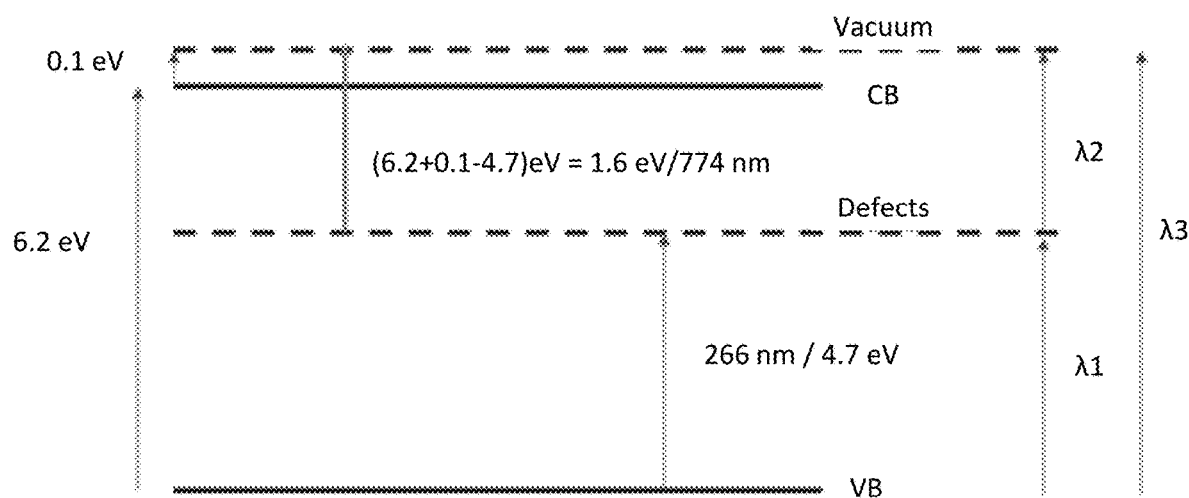
FIG. 3 is a bandgap structure for a CsI photocathode.

Based on the wavelength assignment of FIG. 3, the proposed pumping schemes are: activate color centers with $\lambda 1$ and pump the cathode with $\lambda 2$; activate with $\lambda 1$, pump with $\lambda 1$ and $\lambda 2$; and/or pump with $\lambda 1$ and $\lambda 3$. FIG. 3 illustrates the conduction band (CB) and valence band (VB).

The third pumping scheme using two wavelengths may be an equivalent to electromagnetically-induced transparency (EIT) where $\lambda 1$ blocks the color centers from absorbing $\lambda 3$, which can enable electrons to be pumped directly from the valence band to vacuum. A potential combination of wavelengths for CsI is shown in the table of FIG. 4.

The dual wavelength pumping scheme can minimize required optical power per photogenerated electron, which can provide higher quantum efficiency. Heat dissipation per photogenerated electron also can be minimized. A dual wavelength pumping scheme also can provide improved localization of induced current.

Dual wavelength pumping schemes can be performed concurrently in transmission and reflection mode, which can optimize efficiency.

Longer photocathode and optics lifetimes can be achieved with longer wavelength illumination, such as those using a dual wavelength pumping scheme.

Lower emittance and energy spread can be achieved using longer wavelengths, such as with a dual wavelength pumping scheme. Wavelengths can be tailored to provide a desired energy transition to satisfy the tradeoff between quantum efficiency and transverse energy spread.

Figure 5:
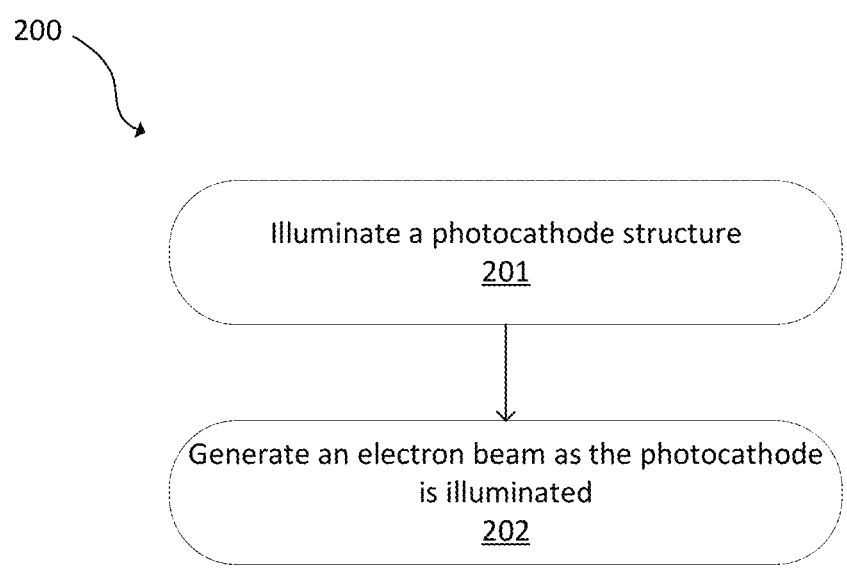
FIG. 5 is a flowchart of a method embodiment in accordance with the present disclosure.

FIG. 5 is a flowchart of a method 200. A photon beam illuminates a photocathode with a dual wavelength scheme at 201. The photocathode includes an alkali halide photocathode.

An electron beam is generated as the photocathode is illuminated with the photon beam at 202. The dual wavelength scheme can operate at short wavelengths, which can include deep ultraviolet wavelengths. This can provide low noise, high stability, and low energy spread. The photocathode may be the photocathode 100, for example.

In an instance, the photocathode includes an alkali halide layer disposed on a body, such as that illustrated in FIG. 1. The body may be fabricated of a wide bandgap semiconductor material and can have a first surface and a second surface opposite the first surface. The body may have a thickness between the first surface and the second surface of less than 100 nm. The alkali halide photocathode emitter can be disposed on the second surface and can have a thickness less than 10 nm. The photocathode also can include a metal layer disposed on the first surface. Other photocathode configurations with an alkali halide layer are possible.

Both wavelengths in the dual wavelength scheme may be configured to pump. The dual wavelength scheme also can include a simultaneous mode with transmission and reflection, with transmission, or with reflection.

Figure 6:
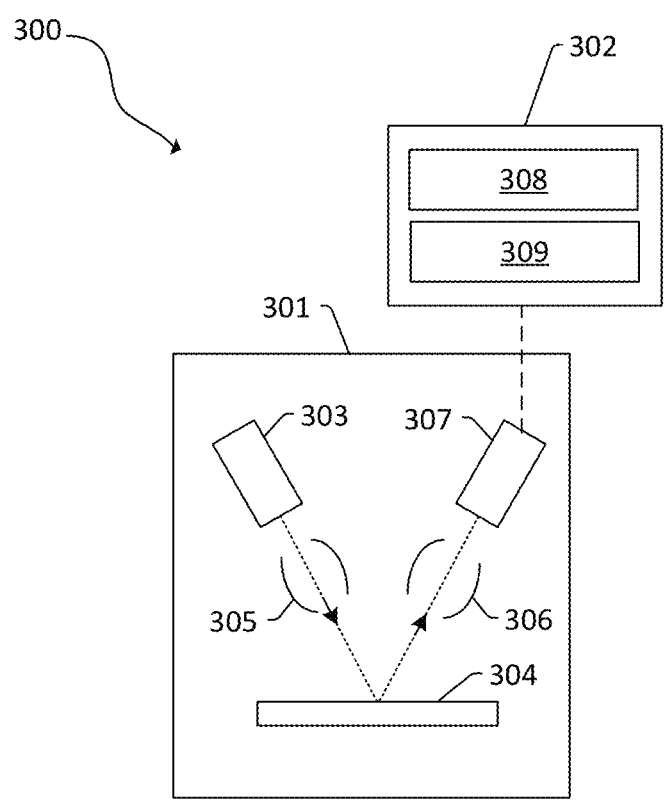
FIG. 6 is a block diagram of an embodiment of a system in accordance with the present disclosure.

FIG. 6 is a block diagram of an embodiment of a system 300. The system 300 includes a wafer inspection tool (which includes the electron column 301) configured to generate images of a wafer 304.

The wafer inspection tool includes an output acquisition subsystem that includes at least an energy source and a detector. The output acquisition subsystem may be an electron beam-based output acquisition subsystem. For example, in one embodiment, the energy directed to the wafer 304 includes electrons, and the energy detected from the wafer 304 includes electrons. In this manner, the energy source may be an electron beam source. In one such embodiment shown in FIG. 6, the output acquisition subsystem includes electron column 301, which is coupled to computer subsystem 302. A chuck (not illustrated) may hold the wafer 304.

As also shown in FIG. 6, the electron column 301 includes an electron beam source 303 configured to generate electrons that are focused to wafer 304 by one or more elements 305.

The electron beam source 303 may include, for example, an embodiment of the photocathode 100 of FIG. 1. The one or more elements 305 may include, for example, a gun lens, an anode, a beam limiting aperture, a gate valve, a beam current selection aperture, an objective lens, and a scanning subsystem, all of which may include any such suitable elements known in the art. The photocathode 100 can operate using the method 200 or other embodiments disclosed herein.

Electrons returned from the wafer 304 (e.g., secondary electrons) may be focused by one or more elements 306 to detector 307. One or more elements 306 may include, for example, a scanning subsystem, which may be the same scanning subsystem included in element(s) 305.

The electron column also may include any other suitable elements known in the art.

Although the electron column 301 is shown in FIG. 6 as being configured such that the electrons are directed to the wafer 304 at an oblique angle of incidence and are scattered from the wafer 304 at another oblique angle, the electron beam may be directed to and scattered from the wafer 304 at any suitable angles. In addition, the electron beam-based output acquisition subsystem may be configured to use multiple modes to generate images of the wafer 304 (e.g., with different illumination angles, collection angles, etc.). The multiple modes of the electron beam-based output acquisition subsystem may be different in any image generation parameters of the output acquisition subsystem.

Computer subsystem 302 may be coupled to detector 307 such that the computer subsystem 302 is in electronic communication with the detector 307 or other components of the wafer inspection tool. The detector 307 may detect electrons returned from the surface of the wafer 304 thereby forming electron beam images of the wafer 304 with the computer subsystem 302. The electron beam images may include any suitable electron beam images. The computer subsystem 302 includes a processor 308 and an electronic data storage unit 309. The processor 308 may include a microprocessor, a microcontroller, or other devices.

It is noted that FIG. 6 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The computer subsystem 302 may be coupled to the components of the system 300 in any suitable manner (e.g., via one or more transmission media, which may include wired and/or wireless transmission media) such that the processor 308 can receive output. The processor 308 may be configured to perform a number of functions using the output. The wafer inspection tool can receive instructions or other information from the processor 308. The processor 308 and/or the electronic data storage unit 309 optionally may be in electronic communication with another wafer inspection tool, a wafer metrology tool, or a wafer review tool (not illustrated) to receive additional information or send instructions.

The computer subsystem 302, other system(s), or other subsystem(s) described herein may be part of various systems, including a personal computer system, image computer, mainframe computer system, workstation, network appliance, interne appliance, or other device. The subsystem(s) or system(s) may also include any suitable processor known in the art, such as a parallel processor. In addition, the subsystem(s) or system(s) may include a platform with high speed processing and software, either as a standalone or a networked tool.

The processor 308 and electronic data storage unit 309 may be disposed in or otherwise part of the system 300 or another device. In an example, the processor 308 and electronic data storage unit 309 may be part of a standalone control unit or in a centralized quality control unit. Multiple processors 308 or electronic data storage unit 309 may be used.

The processor 308 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 308 to implement various methods and functions may be stored in readable storage media, such as a memory in the electronic data storage unit 309 or other memory.

The system 300 of FIG. 6 is merely one example of a system that can use the electron source 100. Embodiments of the electron source 100 may be part of a defect review system, an inspection system, a metrology system, or some other type of system. Thus, the embodiments disclosed herein describe some configurations that can be tailored in a number of manners for systems having different capabilities that are more or less suitable for different applications.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A photocathode comprising:
   a body fabricated of a wide bandgap semiconductor material, wherein the body has a first surface and a second surface opposite the first surface, and wherein the body has a thickness between the first surface and the second surface of less than 100 nm;
   a metal layer disposed on the first surface, wherein in the metal layer is configured as an electrical contact that applies an electric field to guide electrons toward a surface of the photocathode; and
   an alkali halide photocathode emitter disposed on the second surface, wherein the alkali halide photocathode has a thickness less than 10 nm.

2. The photocathode of claim 1, wherein the metal layer includes one or more of platinum or gold.

3. The photocathode of claim 1, wherein the wide bandgap semiconductor material includes an alloy of InGaN.

4. The photocathode of claim 3, wherein the alloy of InGaN is an alloy of InGaN and GaN.

5. The photocathode of claim 1, wherein the wide bandgap semiconductor material includes an alloy of AlGaN.

6. The photocathode of claim 5, wherein the alloy of AlGaN is an alloy of AlGaN and GaN.

7. The photocathode of claim 1, wherein the wide bandgap semiconductor material includes an alloy of InGaP.

8. The photocathode of claim 7, wherein the alloy of InGaP is an alloy of InGaP and GaP.

9. The photocathode of claim 1, wherein the wide bandgap semiconductor material includes at least one of GaN and GaP.

10. The photocathode of claim 1, wherein the alkali halide photocathode includes one or more of CsI, CsBr, or CsTe.

11. The photocathode of claim 1, further comprising a cap layer disposed on the alkali halide photocathode opposite the body.

12. The photocathode of claim 11, wherein the cap layer includes one or more of ruthenium, boron, or platinum.

13. The photocathode of claim 12, wherein the cap layer includes an alloy of ruthenium and platinum.

14. The photocathode of claim 1, wherein the body is p-doped or n-doped with a doping level from $10^{18}$ to $10^{20}$ cm$^{-3}$.

15. An electron beam tool including the photocathode of claim 1, wherein the electron beam tool includes a detector that receives electrons generated by the electron emitter and reflected from a surface of a wafer.

16. A method comprising:
    illuminating a photocathode with a photon beam having a dual wavelength scheme, wherein the photocathode includes a metal layer disposed on a first surface of a body and an alkali halide photocathode emitter disposed on a second surface of the body, and wherein the first surface is opposite the second surface;
    applying an electric field to the metal layer thereby guiding electrons toward a surface of the photocathode; and
    generating an electron beam as the photocathode is illuminated with the photon beam.

17. The method of claim 16, wherein the body is fabricated of a wide bandgap semiconductor material, wherein the body has a thickness between the first surface and the second surface of less than 100 nm, and wherein the alkali halide photocathode has a thickness less than 10 nm.

18. The method of claim 16, wherein both wavelengths in the dual wavelength scheme are configured to pump.

19. The method of claim 16, wherein the dual wavelength scheme includes a simultaneous mode with transmission and reflection.

20. The method of claim 16, wherein the dual wavelength scheme includes a transmission mode or a reflection mode.

* * * * *